(12) United States Patent
Skofljanec et al.

(10) Patent No.: US 7,230,821 B2
(45) Date of Patent: Jun. 12, 2007

(54) HOUSING FOR AN ELECTRONIC CONTROL DEVICE IN VEHICLES

(75) Inventors: Robert Skofljanec, Moos-Bankholzen (DE); Reinhard Lange, Gaienhofen (DE)

(73) Assignee: TRW Automotive Electronics & Components GmbH & Co. KG, Radolfzell (DE)

(*) Notice: Subject to any disclaimer, the term of this patent is extended or adjusted under 35 U.S.C. 154(b) by 244 days.

(21) Appl. No.: 10/253,442

(22) Filed: Sep. 24, 2002

(65) Prior Publication Data

US 2003/0174472 A1 Sep. 18, 2003

(30) Foreign Application Priority Data

Sep. 24, 2001 (DE) .......................... 201 15 659 U

(51) Int. Cl.
*H05K 5/00* (2006.01)
(52) U.S. Cl. .................. 361/679; 361/724; 312/223.11
(58) Field of Classification Search ................ 361/679, 361/724–727, 685, 736, 741, 748, 752, 756, 361/690, 816–818; 312/223.1–223.3
See application file for complete search history.

(56) References Cited

U.S. PATENT DOCUMENTS

| | | | | |
|---|---|---|---|---|
| 5,563,450 A | * | 10/1996 | Bader et al. | 257/785 |
| 5,756,948 A | * | 5/1998 | Husby et al. | 200/61.53 |
| 6,191,950 B1 | * | 2/2001 | Cox et al. | 361/737 |
| 6,275,385 B1 | | 8/2001 | Sahara et al. | |
| 6,361,063 B1 | * | 3/2002 | Daeschner | 280/655 |
| 6,473,298 B1 | * | 10/2002 | Ruckman et al. | 361/685 |
| 6,661,664 B2 | * | 12/2003 | Sarno et al. | 361/719 |

FOREIGN PATENT DOCUMENTS

| | | |
|---|---|---|
| DE | 1845840 U | 2/1962 |
| DE | 1847846 U | 3/1962 |
| DE | 4038788 A1 | 6/1992 |
| DE | 19612063 | 10/1997 |
| DE | 19700558 | 6/1998 |
| DE | 19722602 A1 | 12/1998 |
| DE | 19955589 A1 | 6/2000 |
| DE | 19924344 A1 | 12/2000 |
| DE | 10104568 A1 | 8/2001 |

* cited by examiner

*Primary Examiner*—Yean-Hsi Chang
(74) *Attorney, Agent, or Firm*—Tarolli, Sundheim Covell & Tummino LLP

(57) ABSTRACT

A housing for a control device in vehicles is provided. The housing satisfies the requirements of acceleration transmission and reliable ground connection with a simple and inexpensive construction. The housing comprises a metallic shell that has parallel top and bottom walls, opposed side walls interconnecting the top and bottom walls and an open front face. A shaped carrier structure has a pair of opposed lateral edges. Both side walls of the shell have an internal groove extending parallel to and spaced from the bottom wall of the shell. The carrier structure is accommodated within the shell and has its lateral edges fitted in the grooves of the side walls.

16 Claims, 7 Drawing Sheets

HOUSING FOR AN ELECTRONIC CONTROL DEVICE IN VEHICLES

FIELD OF INVENTION

The present invention relates to a housing for an electronic control device in vehicles.

BACKGROUND OF INVENTION

Electronic control devices in vehicles are exposed to high thermal and mechanical stress. Consequently, they require a sufficiently resistant housing. Especially high demands are made for the housings of control devices that involve an acceleration sensor and that serve to actuate safety equipment in the vehicle, such as a belt tensioner or an airbag. With such control devices, it must be possible to rigidly connect the housing to the car body and to transmit the occurring accelerations to the acceleration sensor. Moreover, for the reliable functioning of the electronic components of the control device, there must be a good ground connection between the housing and the car body on the one hand, as well as between the housing and the electronic control device on the other hand.

These requirements are satisfied in conventional housings with heavy and bulky metallic constructions.

SUMMARY OF INVENTION

The present invention provides a housing that satisfies the requirements of acceleration transmission and reliable ground connection with a simple and inexpensive construction. Specifically, the inventive housing comprises a metallic shell that has parallel top and bottom walls, opposed side walls interconnecting the top and bottom walls and an open front face. A shaped carrier structure has a pair of opposed lateral edges. Both side walls of the shell have an internal groove extending parallel to and spaced from the bottom wall of the shell. The carrier structure is accommodated within the shell and has its lateral edges fitted in the grooves of the side walls. In the preferred embodiment, the shell has its bottom wall attached to a metallic base plate. The grooves are formed by outwardly projecting wall portions and fastener members are provided that are attached to the base plate and engage the projecting wall portions. Preferably, the projecting wall portions are pressed onto the lateral edges of the carrier structure from two opposed sides to establish a secure attachment to the shell and simultaneously a reliable electrical ground connection. The lateral edges may be those of a printed circuit board whereon the electronic components of the device are mounted, or those of a folded sheet metal member on which the printed circuit board is mounted.

The housing of the present invention can be made of just a few easily and inexpensively manufactured components that are assembled with just a few automated steps.

BRIEF DESCRIPTION OF DRAWINGS

Additional characteristics and advantages of the invention ensue from the description below of several embodiments and from the accompanying drawings to which reference is made. In the drawings.

DETAILED DESCRIPTION OF PREFERRED EMBODIMENTS

Figure 1:
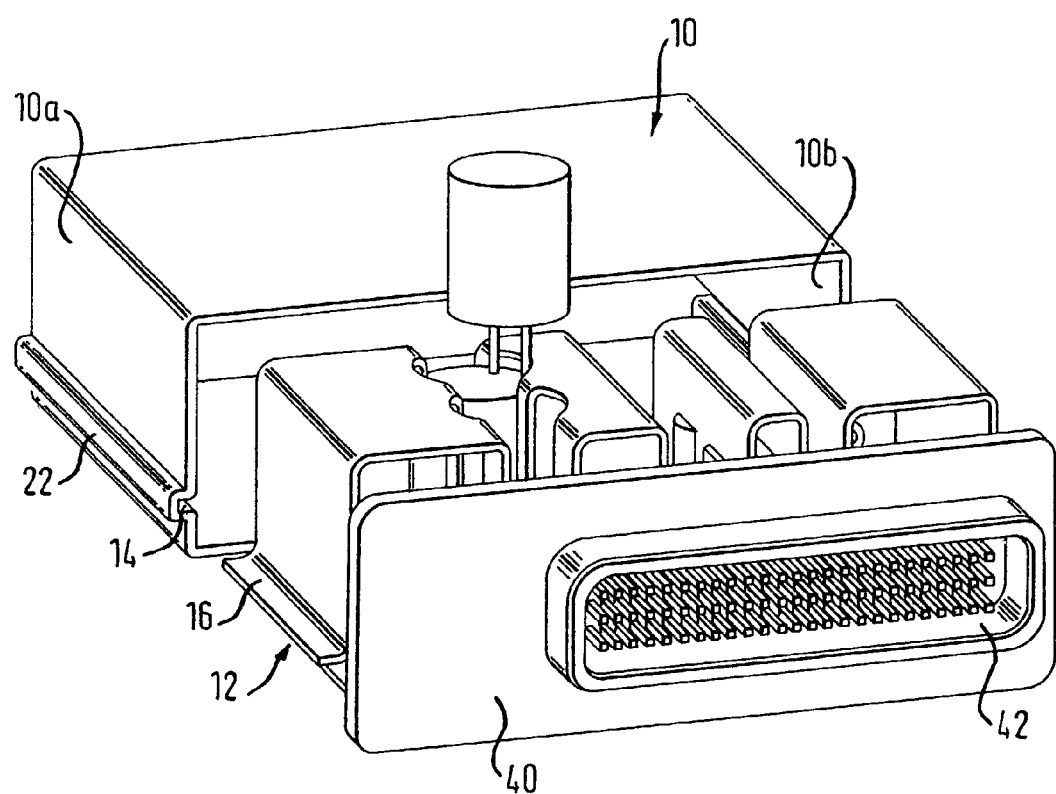
FIG. 1 is an exploded perspective view of a housing consisting of a metallic shell and an internal carrier structure for electronic components that can be slid into the shell.

The housing shown in FIG. 1 for an electronic control device in vehicles comprises a generally parallelepipedal metallic housing shell 10 and a carrier structure 12 for electronic components of the control device. The housing shell 10 is cup-shaped with an open front face through which the carrier structure 12 can be inserted. The housing shell has parallel top and bottom walls and a pair of side walls 10a, 10b interconnecting the top and bottom walls. Side walls 10a, 10b are provided with parallel grooves 14 in which two corresponding lateral edges 16 of the carrier structure 12 engage. The grooves 14 are formed by outwardly projecting wall portions 22 of side walls 10a, 10b. Preferably, the housing shell 10 is made of aluminum by means of flow pressing.

The housing shell 10 is seated onto a base plate 18 and attached to it. On the edges of the base plate 18 corresponding to the side walls 10a, 10b, there are upright support members 20 on which the projecting wall portions 22 of housing shell 10 bear.

Parallel to the support members 20 and along the corresponding edges of the base plate 18, there are upright fastener elements 24 that engage around the outwardly protruding wall portions 22 of housing shell 10.

Figure 2:
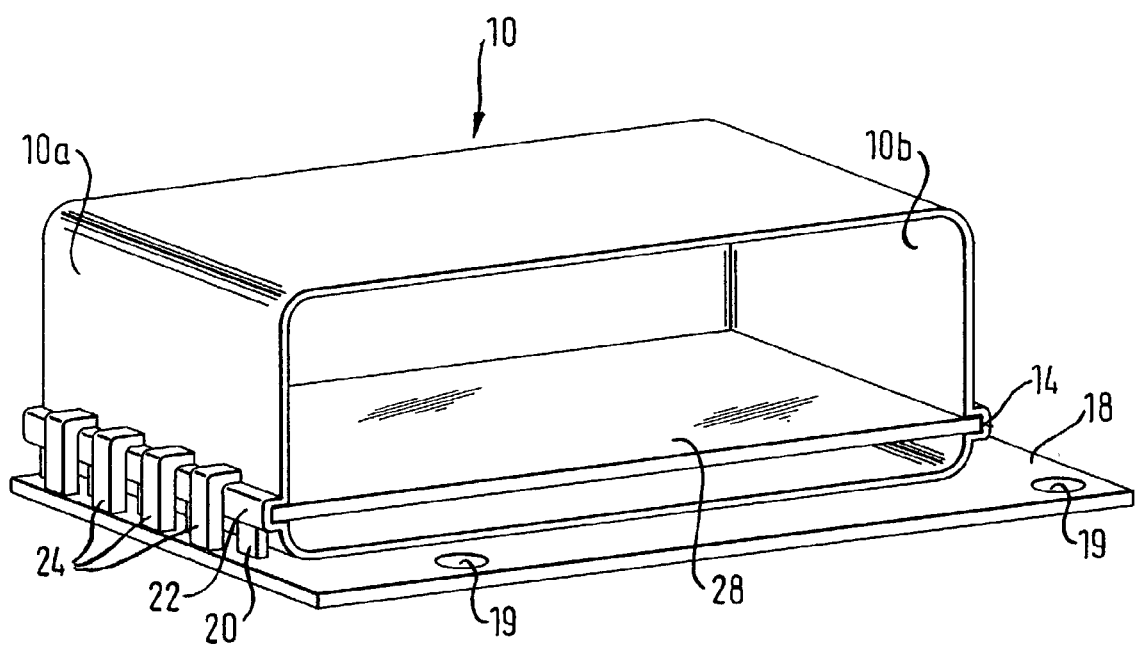
FIG. 2 is a perspective view of a housing shell seated on a base plate, with a printed circuit board slid in place.
Figure 3:
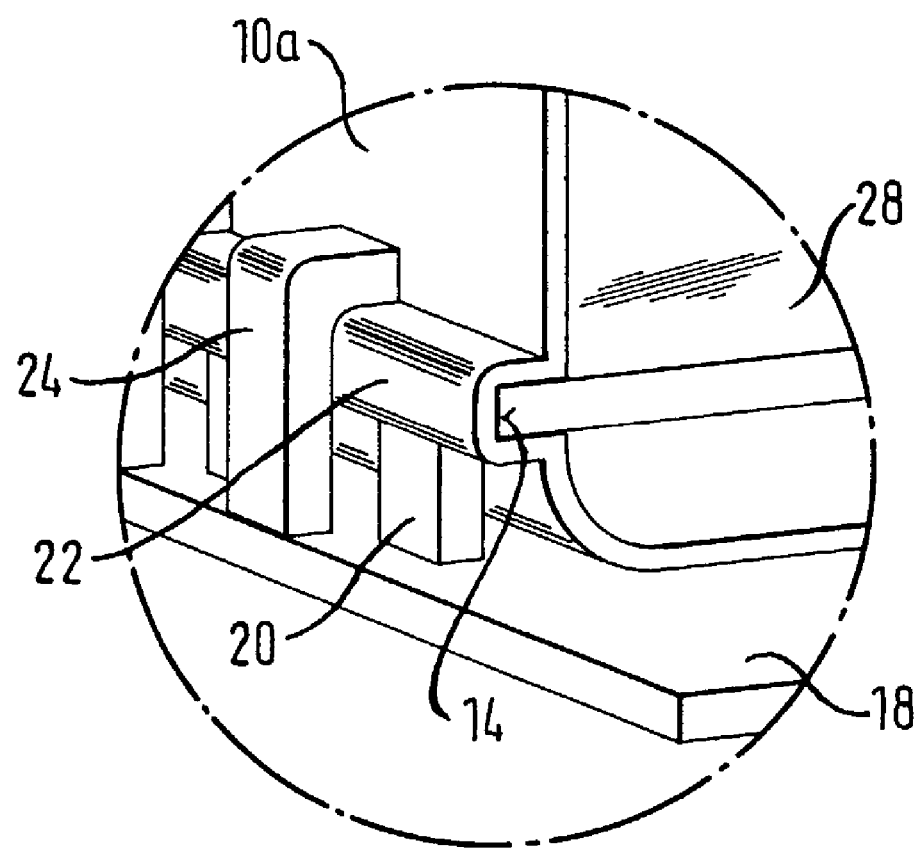
FIG. 3 is an enlarged detail view from FIG. 2.
Figure 6:
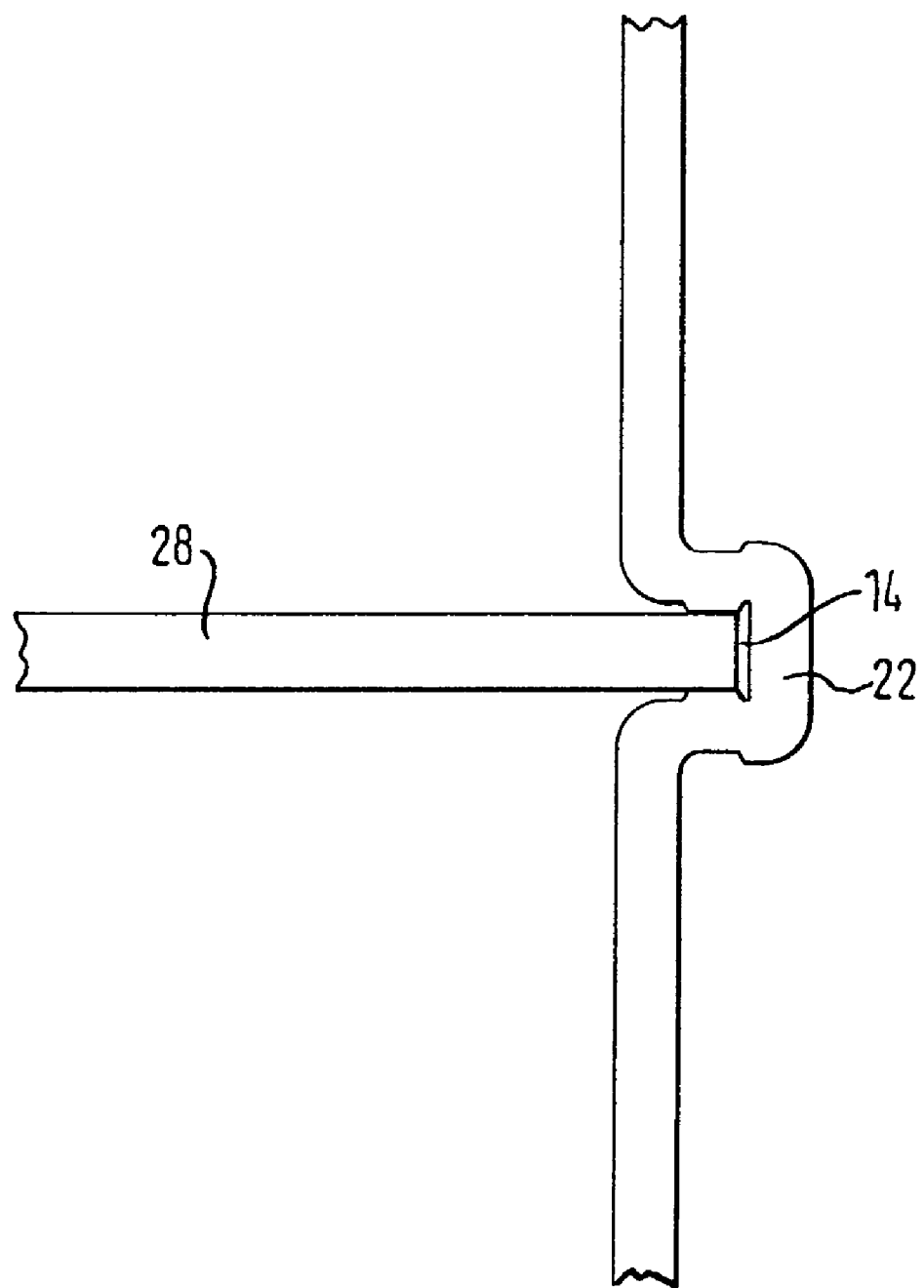
FIG. 6 is an enlarged detail view from FIG. 2.

In the embodiment shown in FIGS. 2 and 3, a printed circuit board 28 is slid into the grooves 14. In order to attach the printed circuit board 28 in the grooves 14 of shell 10, the fastener elements 24 are caulked against the support members 20, whereby the wall portions 22 of housing shell 10 are pinched and consequently the corresponding edge areas of the printed circuit board 28 are clamped. This situation is shown in an enlarged view in FIG. 6. As a result of the pinching of the printed circuit board 28 at its edge areas which are inserted into the grooves 14, an electric ground connection between the printed circuit board and the housing shell is established while providing mechanical stability.

In the embodiment shown in FIG. 2, electronic components of the control device are set up on the printed circuit board 28. One of these components can be an acceleration sensor that is rigidly coupled to the base plate 18 via the printed circuit board and housing shell 10. The base plate 18 has attachment openings 19 for anchoring the housing to a car body.

Figure 4:
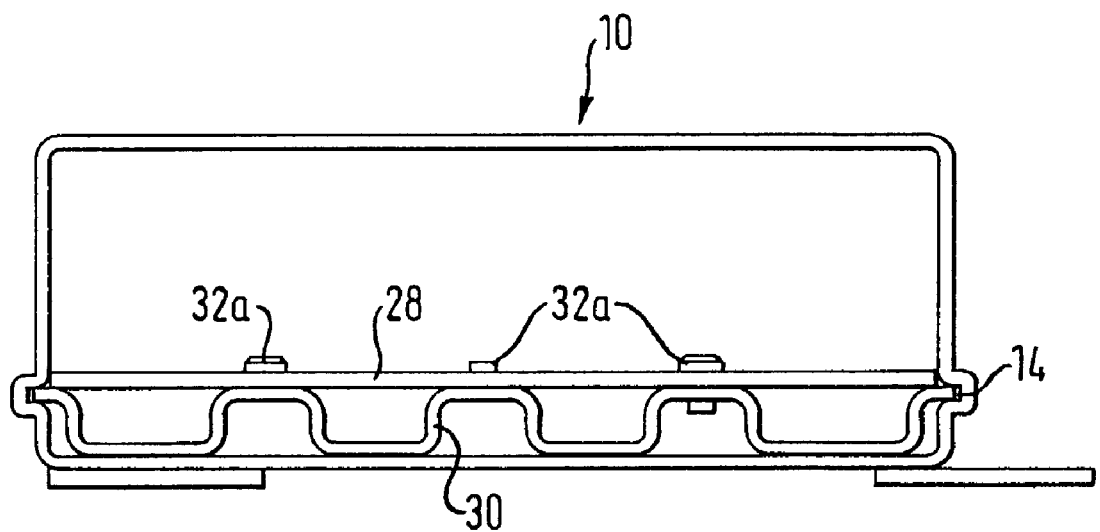
FIG. 4 is a cross section of a particular housing embodiment.

In the embodiment according to FIG. 4, the printed circuit board 28 is attached to a metallic carrier plate 30. The cross section of the carrier plate 30 has a meander-shaped profile, with support surfaces lying against the printed circuit board and, spaced from the support surface, with support surfaces bearing on the bottom of housing shell 10. Unlike the embodiment of FIG. 2, it is not the edge areas of the printed circuit board 28 but rather the edge areas of the carrier plate 30 that engage in the grooves 14. They are attached and contacted there in the same manner as was explained with reference to FIGS. 3 and 6. An electrically conductive connection between the metallic carrier plate 30 and the printed circuit board 28 is redundantly achieved at plural attachment points, such as the attachment points 32a in FIG. 4.

Figure 5:
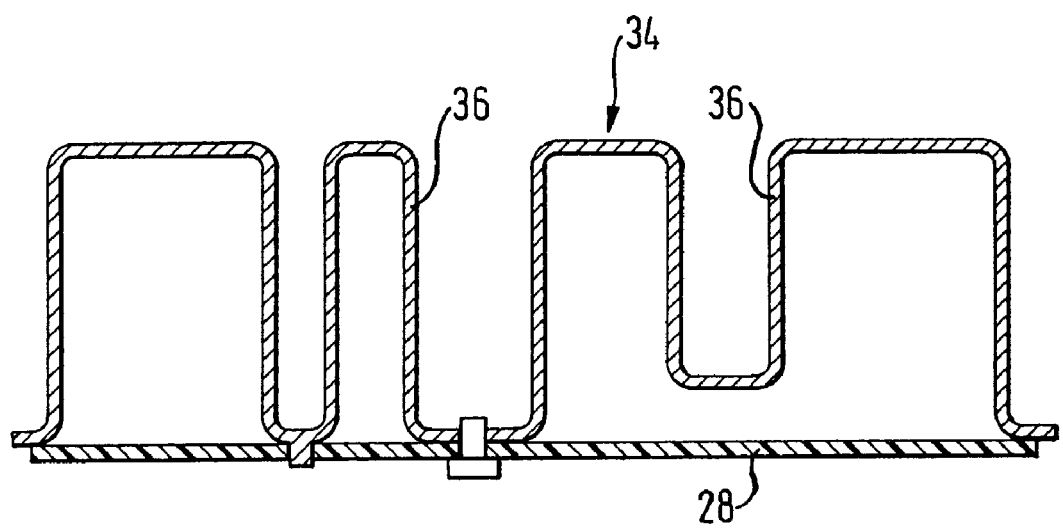
FIG. 5 is a cross section of a carrier structure with a printed circuit board.

As an alternative or in addition to the embodiment shown in FIG. 4, as indicated in FIG. 5, a mechanical support structure 34 is attached on the printed circuit board 28 on its side facing away from the bottom of the housing shell 10.

Figure 7:
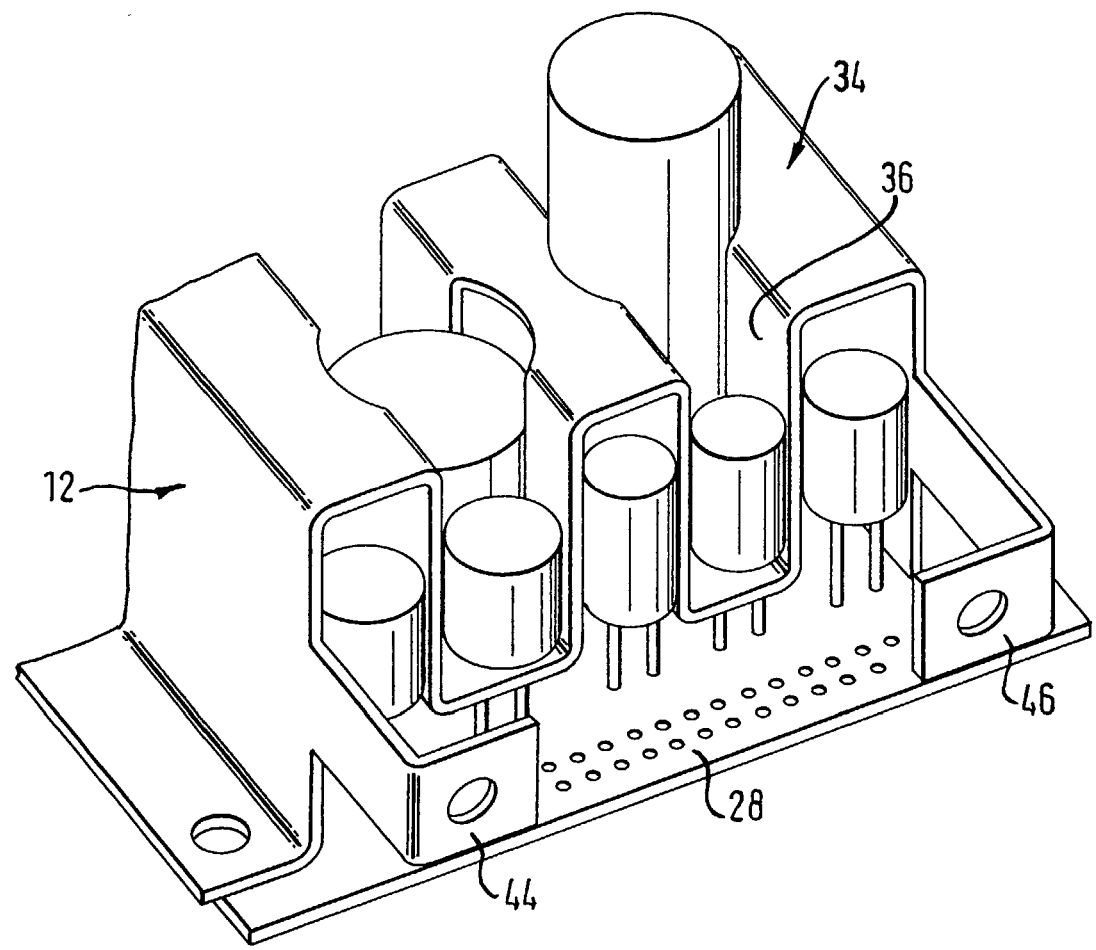
FIG. 7 is a perspective partial view of a carrier structure with electronic components and a printed circuit board attached to the structure.

The cross section of the mechanical support structure 34 is generally meander-shaped, with upright support walls 36 bent up at a right angle, on which electronic components of the control device can be supported. FIG. 7, for example, shows a number of capacitors that are set up on the printed circuit board 28 and supported by the support walls 36 of the support structure 34.

The open front of housing shell 10 is closed by a front plate 40 that carries a plug socket 42. The front plate 40 is attached to the carrier structure 12. In order to attach the front plate 40 to the carrier structure 12, it is provided with angled tabs 44, 46 on which the inner surface of the front plate 40 comes to rest.

All of the embodiments have in common the fact that, in spite of the use of relatively easily and inexpensively manufactured components of the housing, a mechanically stiff structure is obtained. Therefore, the housing is also suitable for control devices such as actuation devices in safety equipment of the vehicle which use an acceleration sensor set up on the printed circuit board. The electrical ground connection between the outer housing and the printed circuit board, which is needed for such applications, is also ensured.

The invention claimed is:

1. A housing for an electronic control device in vehicles, comprising a metallic shell that has parallel top and bottom walls, opposed side walls interconnecting said top and bottom walls and an open front face, a shaped carrier structure that has a pair of opposed lateral edges, each of said side walls having an internal groove extending parallel to and spaced from said bottom wall, said grooves being formed by outwardly projecting wall portions of said side walls, and said carrier structure being accommodated within said shell and having said lateral edges fitted in said grooves, said housing further comprising a base plate which is arranged parallel to said carrier structure and to which said shell is attached and fastener members that are attached to said base plate and engage said projecting wall portions of said side walls.

2. The housing of claim 1, wherein said projecting wall portions bear on support members carried by said base plate, and are clamped between said fastener members and said support members.

3. The housing of claim 2, wherein said fastener members are pressed onto said projecting wall portions.

4. The housing of claim 1, wherein said carrier structure comprises a printed circuit board and said lateral edges are those of said printed circuit board.

5. The housing of claim 1, wherein said carrier structure comprises a folded sheet metal member and a printed circuit board attached to said sheet metal member, said lateral edges being provided on said sheet metal member.

6. The housing of claim 5, wherein said sheet metal member has first wall portions bearing on said bottom wall of the shell and second wall portions parallel to and spaced from said first wall portions, and the printed circuit board is attached to said second wall portions.

7. The housing of claim 5, wherein said sheet metal member has wall portions erected on said printed circuit board to support electronic components of said control device.

8. A housing for an electronic control device in vehicles, comprising a metallic shell that has parallel top and bottom walls, opposed side walls interconnecting said top and bottom walls over the whole length of said top and bottom walls to form outer side walls of said metallic shell, and an open front face, said outer side walls being essentially perpendicular to said top and bottom walls, and further comprising a shaped carrier structure that has a pair of opposed lateral edges, each of said outer side walls having an internal groove extending parallel to and spaced from said bottom wall, said grooves being formed by outwardly projecting wall portions of said outer side walls, said carrier structure being accommodated within said shell and having said lateral edges fitted in said grooves, and said outwardly projecting wall portions being deformed for directly contacting said lateral edges of said carrier structure to establish an electrical ground connection between said shell and said carrier structure.

9. The housing of claim 8, wherein said outwardly projecting wall portions directly contact said lateral edges of said carrier structure thereby establishing an electrical ground connection between said shell and said carrier structure.

10. A housing for an electronic control device in vehicles, comprising a metallic shell that has parallel top and bottom walls, opposed side walls interconnecting said top and bottom walls over the whole length of said top and bottom walls to form outer side walls of said metallic shell, and an open front face, and further comprising a shaped carrier structure that has a pair of opposed lateral edges, each of said outer side walls having an internal groove extending parallel to and spaced from said bottom wall, said grooves being formed by outwardly projecting wall portions of said outer side walls, said carrier structure being accommodated within said shell and having said lateral edges fitted in said grooves, and said outwardly projecting wall portions being configured for directly contacting said lateral edges of said carrier structure to establish an electrical ground connection between said shell and said carrier structure.

11. The housing of claim 10, wherein said carrier structure comprises a printed circuit board and said lateral edges are those of said printed circuit board.

12. The housing of claim 10, wherein said carrier structure comprises a folded sheet metal member and a printed circuit board attached to said sheet metal member, said lateral edges being provided on said sheet metal member.

13. The housing of claim 12, wherein said sheet metal member has first wall portions bearing on said bottom wall of the shell and second wall portions parallel to and spaced from said first wall portions, and the printed circuit board is attached to said second wall portions.

14. The housing of claim 12, wherein said sheet metal member has wall portions erected on said printed circuit board to support electronic components of said control device.

15. The housing of claim 10 wherein the electronic control device comprises an acceleration sensor, said acceleration sensor being provided on said carrier structure.

16. The housing of claim 10, wherein said outwardly projecting wall portions are deformed and directly contact said lateral edges of said carrier structure to establish an electrical ground connection between said shell and said carrier structure.

* * * * *